United States Patent [19]
Fleming et al.

[11] Patent Number: 5,523,591
[45] Date of Patent: Jun. 4, 1996

[54] ASSEMBLY OF LED ARRAY AND LENS WITH ENGINEERED LIGHT OUTPUT PROFILE AND METHOD FOR MAKING THE ASSEMBLY

[75] Inventors: Paul J. Fleming, Lima; Gopalan Rajeswaran; Yee S. Ng, both of Fairport, all of N.Y.

[73] Assignee: Eastman Kodak Company, Rochester, N.Y.

[21] Appl. No.: 377,882

[22] Filed: Jan. 25, 1995

[51] Int. Cl.$^6$ ................................................ H01L 33/00
[52] U.S. Cl. ........................... 257/91; 257/98; 257/99
[58] Field of Search ............................ 257/91, 98, 99, 257/88, 437; 345/43, 46, 147; 346/238

[56] References Cited

U.S. PATENT DOCUMENTS

| | | | |
|---|---|---|---|
| 4,644,342 | 2/1987 | Abbas | 340/762 |
| 4,728,981 | 3/1988 | Koek et al. | 355/1 |
| 4,956,684 | 9/1990 | Urata | 257/98 |
| 5,077,587 | 12/1991 | Albergo | 257/98 |
| 5,250,820 | 10/1993 | Sawase et al. | 257/99 |
| 5,317,344 | 5/1994 | Beaman et al. | 346/107 R |

OTHER PUBLICATIONS

Lens Testing: The Measurement of MTF by Carallas and Fantone Photonics Spectra Sep. 1989, pp. 133–138.

*Primary Examiner*—Rolf Hille
*Assistant Examiner*—Minhloan Tran
*Attorney, Agent, or Firm*—Norman Rushefsky

[57] ABSTRACT

An assembly of an LED array of LED elements and lens array provides for improved flattening of the peaks and valleys of the light profile emitted by the array after lensing. The assembly employs the line spread function (LSF) of the lens to determine the positioning of opaque electrodes overlying each LED region. The electrodes then function not only as a means for current injection into the LED, but also to modulate light intensity across the width of the region to aid in properly shaping the LED light output profile to best fit the lens characteristics. The LSF of the lens may also be used to define areas in which to adjust the light-emitting layer or anti-reflection coating thicknesses in directions extending across the LED regions to accentuate or attenuate light output intensity. Preferably, diffusion of specific subregions to different depths within each light-emitting region of an LED element and/or the adjustment of anti-reflection/coating thicknesses over specific sub-regions of each LED element are employed.

7 Claims, 9 Drawing Sheets

ASSEMBLY OF LED ARRAY AND LENS WITH ENGINEERED LIGHT OUTPUT PROFILE AND METHOD FOR MAKING THE ASSEMBLY

FIELD OF THE INVENTION

The present invention relates to an assembly of an array of light-emitting diodes (LED) and a lens and to a method of fabricating an array of LED elements.

BACKGROUND OF THE INVENTION

The increasing use of information processing devices such as word processors, high speed photocopiers, and the like has resulted in the emergence of various types of printers to output the information. For applications in which the emphasis is on quietness, high speed and high print quality, the most extensively used printers are electrophotographic printers. Laser printers and liquid-crystal printers are two examples of such printers, but in addition there is the LED printer, which uses a print head comprised of arrays of LED elements. In the LED printer, printing involves using image data signals applied to LED driver integrated circuits (ICs) to drive the print head LED array elements and form an electrostatic latent image on a photosensitive medium, and the image is then developed and transferred to paper.

The LED element is a semiconductor device that emits radiation in the optical spectrum (i.e., infrared through ultra violet) in response to an applied forward bias voltage from an external power source, in this case, the driver IC. An LED has a p-n junction provided by two extrinsic gallium arsenide alloy-based semiconductors. When forward biased by an external power source, such a diode emits optical radiation or light which can discharge a charged photosensitive medium. LEDs are attractive light sources because they are easy to form, inexpensive to make, highly efficient, and reliable.

High-density, linear LED arrays can be fabricated in monolithic arrays and used as light sources in conjunction with driver ICs and lens system of a print head. In printing applications, light from the diodes of an array forms a line of light images at corresponding pixels of an image zone. A photosensitive medium is positioned (a line at a time) at the image zone to be exposed by these light images. With existing technology, it is possible to fabricate an array of light-emitting diodes on a single gallium arsenide chip. Discrete regions of the array constitute a picture element region (pixel) of the array. Each array pixel includes a single LED region which can illuminate a particular image zone pixel. Binary and grey scale exposures of image zone pixels may be produced by selectively modulating the current level through or the on time of the LED elements for either fixed (binary) or variable (grey scale) printing.

Current state of the art in the manufacture of LED based optical printhead systems is to obtain as flat a light profile as possible in the intensity of the light emitted across the light-emitting surface of the active region of each individual LED element of the LED arrays on a printhead. Uniformity of the light intensity from LED region to LED region of the printhead is critical in such printing applications because the photosensitive medium is capable of resolving fine variations in light intensity and reproduce the variations as streaks or rasterbands extending down the moving receiver or print media.

In order to print a line of print across standard width paper with sufficient resolution, a linear LED printhead is constructed of a series of LED arrays aligned end-to-end, wherein each LED array typically comprises 64, 96, 128 or 196 LED elements. The LED elements on each LED array are aligned in a row and each LED element occupies a certain amount of space on the array. The physical size and spacing of the LED elements, together with an appropriately sized SELFOC lens array for focusing light from the LEDs onto the photosensitive medium, provides standard resolution levels for printheads such as 200, 240, 300, 400, 480 and 600 dots per inch (DPI) or 7.87, 9.45, 11.81, 15.75, 18.90 and 23.62 dots per mm (DPMM).

Figure 1:
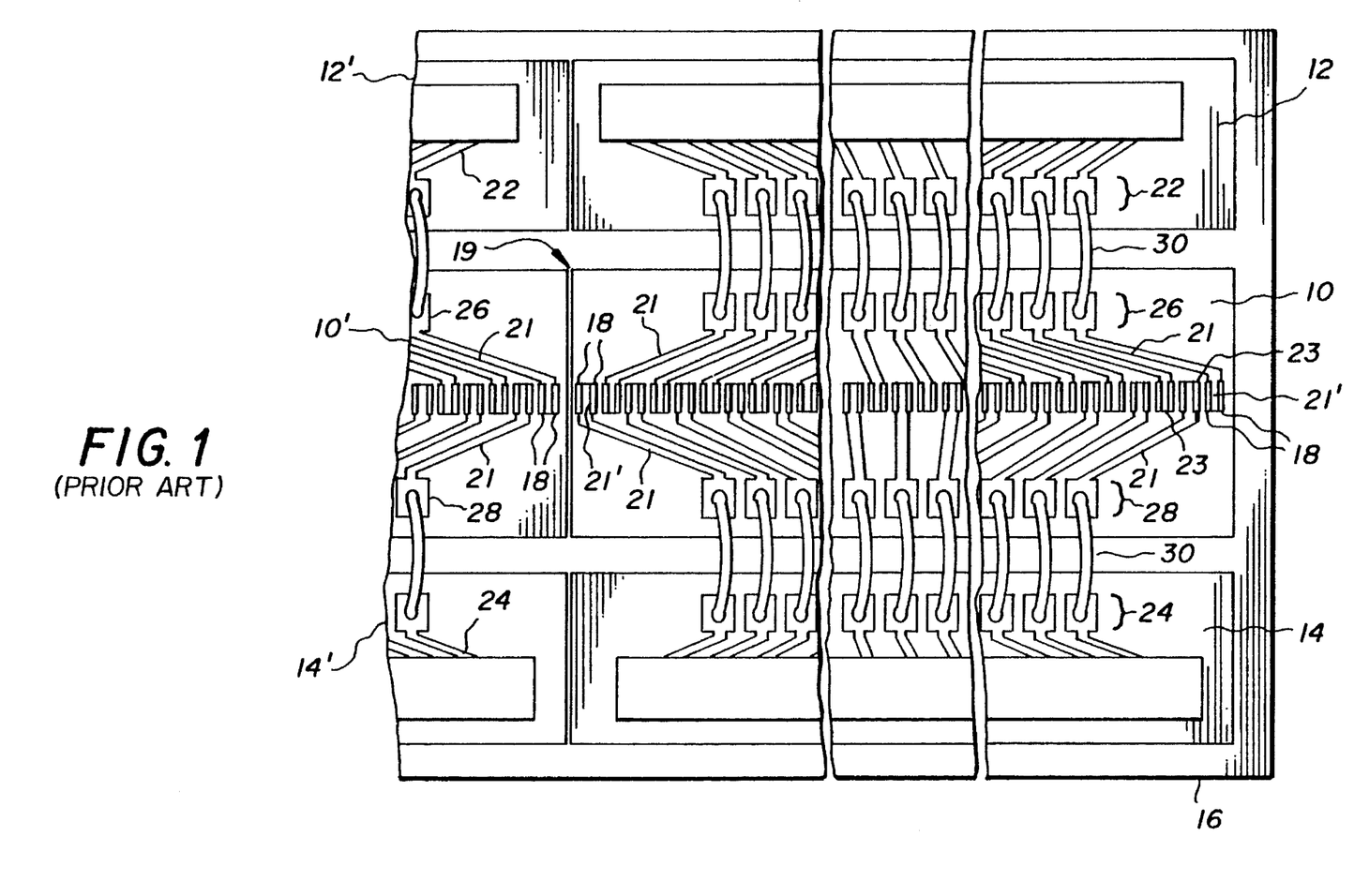
FIG. 1 shows a plan view of a portion of a known LED printhead that includes an LED array or IC illustrating a center location of the exciting electrodes overlying the centerline of each LED region.

In such optical printer printheads, the LED array and LED driver circuit ICs may be mounted on a metallic "tile" or a ceramic substrate and electrically connected by wire bonding. FIG. 1 shows a known method of mounting an optical printer LED array and LED driver ICs where the odd and even numbered sets of LED elements are connected respectively to odd and even driver circuit ICs 12 and 14. An optical printhead LED array 10 and the driver ICs 12 and 14 are arranged side-by side in straight lines on the tile 16 or other substrate and bonded thereto with an adhesive such as silver epoxy resin. A series of LED arrays and a series of driver ICs are each assembled end-to-end on the substrate to form an elongated LED printhead having a gap 19 between each LED array that maintains uniform spacing between adjacent LEDs at the ends of butting arrays. Examples of such printheads are well known, for example, see U.S. Pat. No. 5,317,344.

The LED arrays 10, 10' each comprise a fixed number, e.g. 128, individual LED elements 18, for 400 DPI or 15.75 (DPMM) resolution, wherein the 64 odd and even LED elements each have an associated bonding pad arranged in pad array rows 26 and 28 extending alongside either side of the row of LEDs. Rows 22 and 24 of driver IC bonding pads are respectively lined up adjacent to the LED pad rows 26 and 28 and formed on the driver ICs. Pads in adjacent pad rows are connected by wire bonding using aluminum or gold wires 30 several tens of micrometers in diameter to thereby enable the LED elements to be driven by the driver circuit ICs 12 and 14.

Surface metal trace conductors 21 extend from the LED bonding pads and terminate in electrodes 21' overlying an active, light-emitting region 18 of each LED element. The electrodes 21' are opaque and block the emission of light from the element. Typically, the electrodes 21' are narrow bands or finger-like traces of metallization extending across the center of the active region 18 as shown in FIG. 1. The width of the electrodes is typically selected in relation to the width of the light-emitting region 18 of each element to take into account the current spreading resistance which causes light output to fall off as one moves farther from the electrode 21' and toward the lateral edges of the region 18. When individual LEDs are formed in an array as shown in FIG. 1, it is necessary to maintain a gap 23 between individual diffusion areas of adjacent LED elements to keep the devices from shorting together. These effects and requirements cause a repeating pattern of reduced light intensity extending lengthwise along the LED array which are measurable as a varying intensity light profile. For high resolution printing systems, the varying intensity light profile, if imaged by the lens system on the moving photosensitive medium, can be seen in the successive line images printed as streaks or rasterbands.

Figure 12:
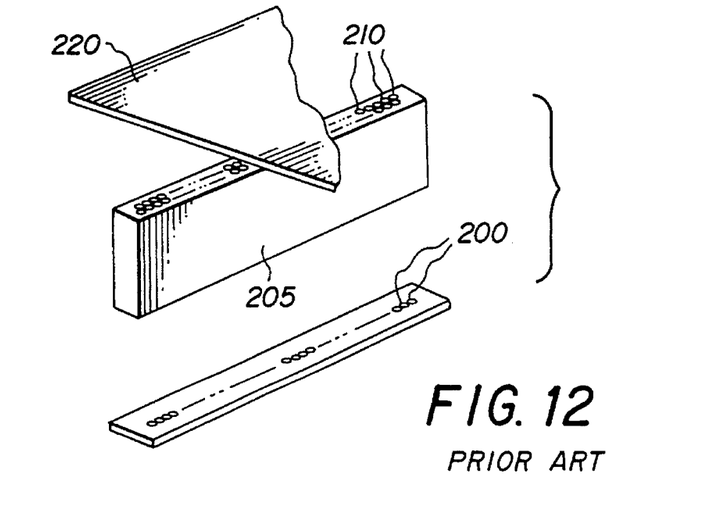
FIG. 12 is an illustration of a SELFOC lens that is located between a recording surface and an LED array.

LED arrays of the type shown in FIG. 1 employed in photocopiers are typically coupled with a SELFOC lens array (trademark of Nippon Sheet Glass) or other optical imaging systems. Examples of mounts for assembling the SELFOC lens array to an array of LEDs that have integrated circuit drivers connected thereto for providing current to the LEDs is shown in U.S. Pat. No. 4,728,981, the contents of which are incorporated herein by reference. The particular mount is not critical and others are also known in the prior art. In FIG. 12, there is shown a prior art LED array 200 SELFOC lens array 205 and having recording fibers 210 and recording member or medium 220 are illustrated to show their general relationship. The light emitted by each element, located generally at an object plane of the lens array, is focused onto the electrostatically charged photosensitive medium or other types of media such as photographic film, etc. so that image pixels may be generated from the selective energization of the LED elements following a number of known LED printing conventions. The lens array is composed of a number of columnar lens elements which are similar to short light pipes having a diameter that is greater than the width of the high resolution LED elements. The lens array thus focuses light from more than one LED element onto an exposure line on the charged photosensitive medium that is located generally at an image plane of the lens array. The lens array exhibits a specific Modulation Transfer Function (MTF) and Line Spread Function (LSF) that roughly relates to the sharpness of focus of light entering the lens element at one end and exiting onto an image pixel space in a line on the photosensitive medium.

The SELFOC lens is a gradient index lens which exhibits blurring of the image as characterized by the lens' MTF curve as described, for example, by Carellas and Fantone, "Lens Testing: The Measurement of MTF", *PHOTONICS SPECTRA*, pp. 133–138, September 1989. An MTF curve for a particular lens is a mapping of contrast, indicated in percent, against spatial frequency, indicated in line pairs per millimeter (lp/mm). The MTF of a lens is typically tested at the center of the lens' field of coverage or at other points displaced from the center and at various apertures, if the aperture is variable. The SELFOC lenses have fixed apertures, and testing is conducted on axis through the center of the lens array with LEDs centered.

The effect of this blurring is to cause the light profile of the individual LED element after focusing by the SELFOC lens to be further altered. Since it is the light profile of an energized LED element after lensing, i.e. passing through the lens, which exposes image pixels on the photosensitive medium, the lens' characteristics affect image quality.

Moreover, when a series of LED arrays 10, 10' and associated driver circuit ICs 12, 12' and 14, 14' are assembled end-to-end to form a linear LED print head array 11 of sufficient length to image lines on a photosensitive medium to print full sized text or images, imperfect assembly of the LED arrays may result in further light profile changes.

In U.S. Pat. No. 4,956,684, the light profile emitted by the array of LED elements in a single IC and abutted ICs making up a linear IC array is modified to decrease the attenuation at the edges of the adjoining LED regions by applying a diffractive coating overlying the edge portions of adjacent regions. The amplitude extremes in the light profile before and after lensing are said to be diminished. Other approaches to smoothing out the light profile of the LED array are summarized in the Background of the Invention of the '684 patent. Despite these approaches taken to reduce the light profile variations, a problem remains in image quality due to light profile intensity variations contributed by the size and spacing requirements of the LED regions, the LED energizing electrodes and the assembly of separate LED arrays into a linear LED print head.

SUMMARY OF THE INVENTION

It is therefore an object of the present invention to provide a more uniform light profile for an assembly of an array of light-emitting elements and a lens that takes into account the characteristics of the lens in the selection of the dimensions and light intensity output of sub-regions of each light-emitting elements.

In accordance with one aspect of the present invention, there is provided an apparatus comprising a combination of a lens array and an array of a plurality of discrete light-emitting elements, the light-emitting elements of the array including a respective plurality of light-emitting regions formed side-by-side in a semiconductor substrate, each region forming a light-emitting element having a centerline and a predetermined width and each region separated from an adjacent region by a gap distance; a pair of opaque finger-like traces overlying each region, each trace having a centerline extending in parallel with the element centerline and spaced on either side thereof to separate each light-emitting region into three sub-regions; and said lens array being located at a distance spaced from said elements so that the elements are positioned at least approximately in an object plane of said lens array, said lens array having a line spread function (LSF) performance characteristic and said centerline of each trace being located such that the LSF of the lens array when convoluted with the light output profile of one of the elements taken at each centerline of the electrodes of said one of said elements forms at a corresponding image plane of the lens array a respective local minimum at a location corresponding to a gap between said one element and a respective adjacent element adjacent said one element, said respective adjacent element being the closest adjacent element to a respective one of said electrodes.

In accordance with another aspect of the invention, an apparatus, comprising a lens array; a plurality of spaced light-emitting elements arranged in a row and provided at least approximately in an object plane of the lens array, each light-emitting element including a center light-emitting portion and side light-emitting portions, said portions being arranged in the direction of said row; an anti-reflection coating arranged over each of said portions and wherein the thickness of the coating over the center portion is different than those over the edge portions so as to reduce emissions from said center portion and thereby flatten the light emission profile of each light-emitting element after lensing by said lens array.

In accordance with yet another aspect of the invention, there is provided an apparatus comprising a lens array; a plurality of spaced light-emitting elements arranged in a row and provided approximately in an object plane of the lens array; each light-emitting element including a center light-emitting portion and side light-emitting portions, said portions being arranged in the direction of said row; each light-emitting element being formed in a semiconductor substrate having a light generating diffusion region, the thickness of a light-generating diffusion region beneath a center light-emitting portion being different than that of a light-generating diffusion regions beneath the side portions to flatten the light emission profile of each light-emitting element after lensing by said lens array, and wherein there is a step change in diffusion region thickness between a diffusion region beneath a center light-emitting portion and a diffusion region beneath a side region.

BRIEF DESCRIPTION OF THE DRAWINGS

Further objects, advantages and features of the invention in its various embodiments will become more apparent from the accompanying drawings and following detailed description of the invention, wherein.

The drawings are not necessarily to scale.

DETAILED DESCRIPTION OF THE PREFERRED EMBODIMENTS

The present invention involves the tailoring of the dimensions and/or configuration of the light-emitting regions and associated electrodes of an LED array to characteristics of the selected lens system employed to form a pixel of illumination corresponding to the illuminated LED element on a receiver. The MTF and the associated LSF of a typical idealized lens system, e.g. a SELFOC SLA 12 6C32HR lens are depicted in FIGS. 2 and 3.

Figure 2:
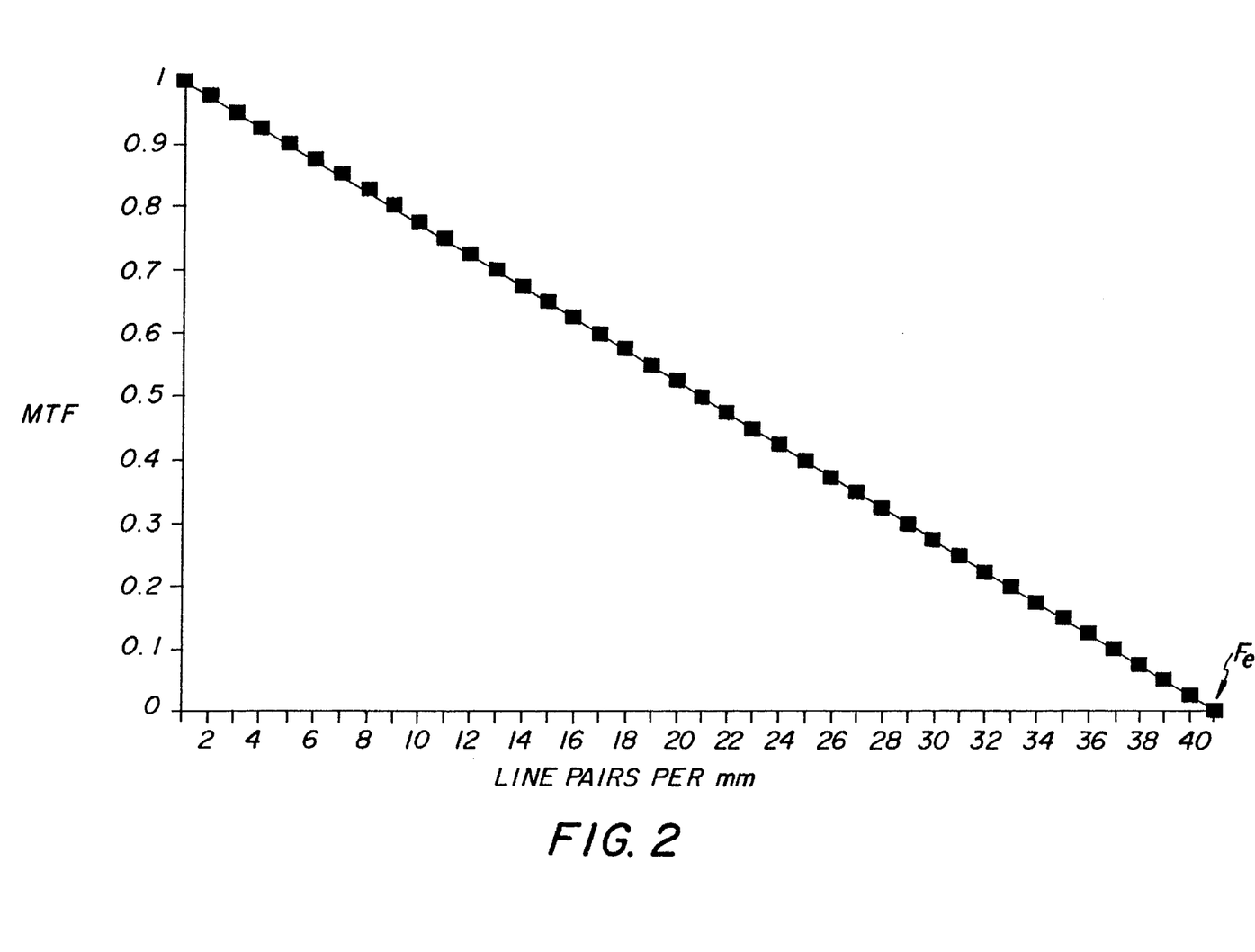
FIG. 2 is a graph illustrating the MTF curve of a typical SELFOC lens usable in the present invention.

The MTF depicted in FIG. 2 is a measure of the ability of the lens system to transfer levels of detail in an object to an image of the object formed by the lens system. The levels of detail in an object or image relate to resolution and are typically specified as line pairs per millimeter (lp/mm), where a line pair is a pair of black and white lines of equal width. The ability of the lens system to resolve the contrast between adjacent black and white line pairs is dependent on the number of repeating line pairs per millimeter which is referred to as the spatial frequency or F.

The MTF is specified in terms of relative contrast, where contrast is the difference in brightness between adjacent tones. Peak contrast is nominally labeled "1" and decreases to "0" (no contrast) along the abscissa of FIG. 2. In the typical lens system, contrast declines as spatial frequency increases, as is the case in FIG. 2, until it reaches zero at an extinction frequency $F_e$. The relationship between the lens' contrast and resolution is shown along the curve decreasing from peak contrast at one lp/mm to no contrast at about 41 lp/mm.

Figure 3:
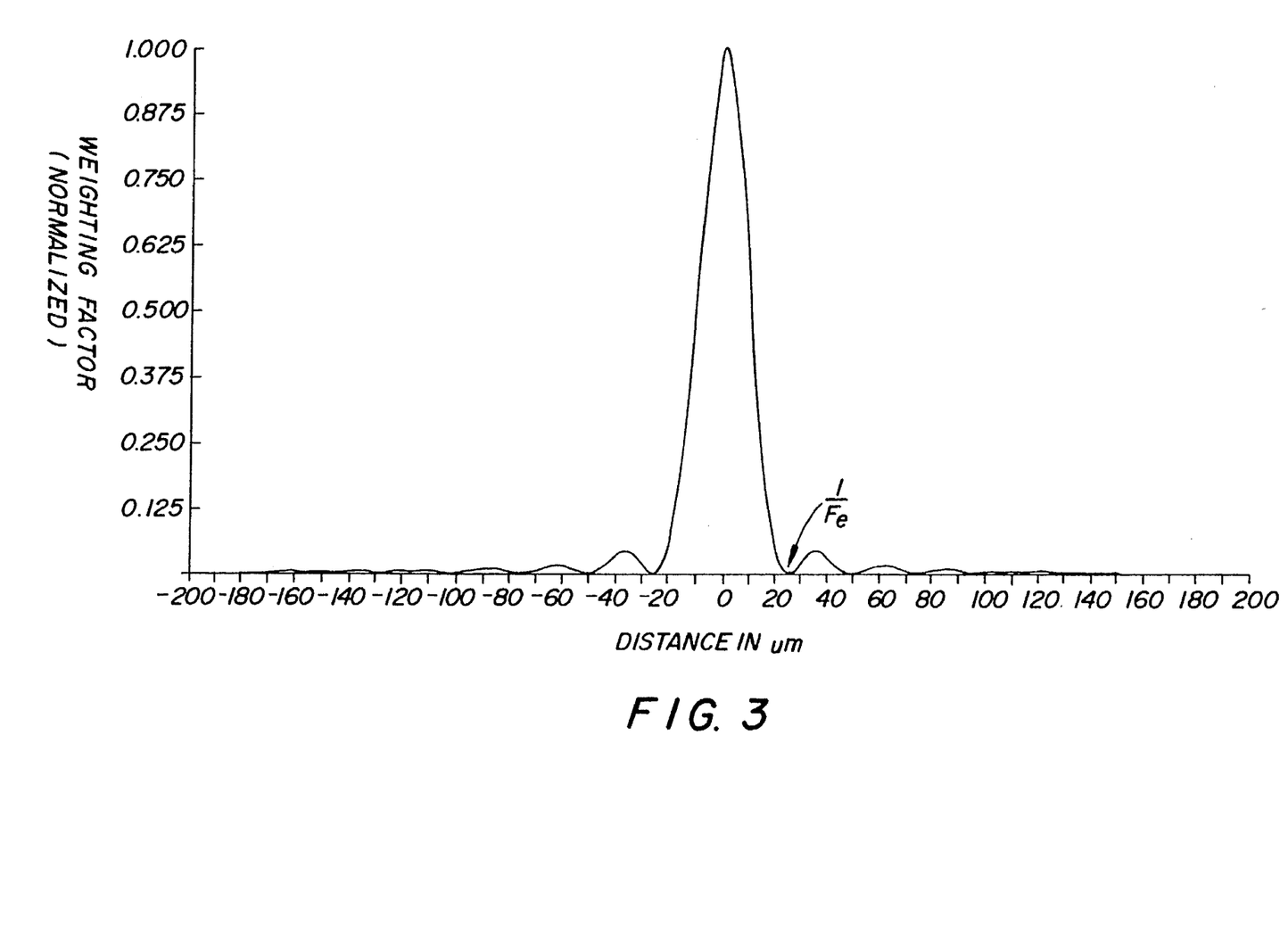
FIG. 3 is a graph illustrating the LSF of the lens of FIG. 2.

Turning to FIG. 3, it depicts the LSF of the lens of FIG. 2. When an impulse signal is imaged with the lens of FIG. 2, the resulting response is a spatial distribution of illumination described by the LSF. The abscissa of the LSF distribution curve depicted in FIG. 3 is expressed as a "Weighting Factor" having a peak at the point of highest contrast. The ordinate is expressed in micro meters (μm) from 0 to ±200 μm from the spatial location of the impulse signal.

Figure 4:
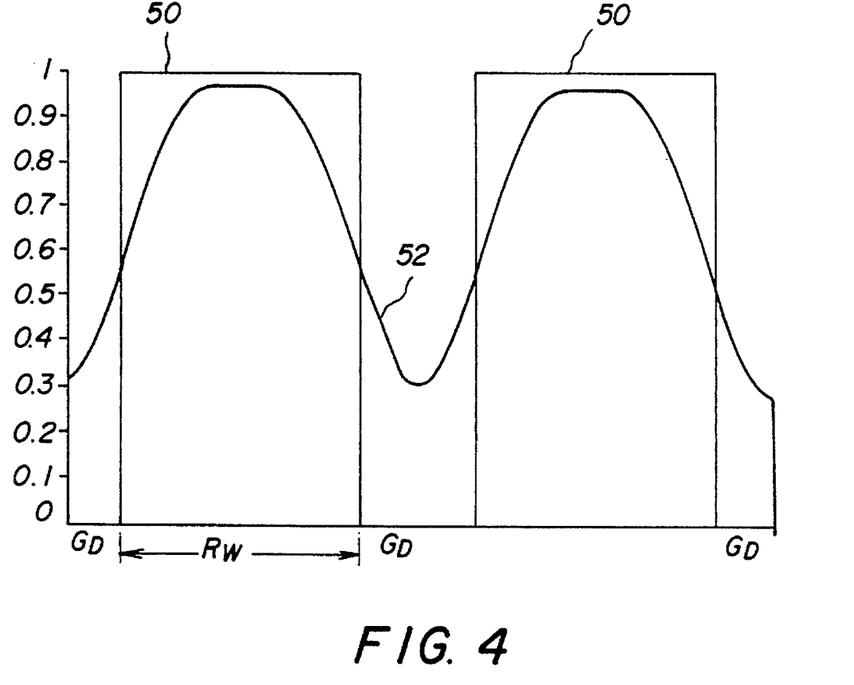
FIG. 4 is an illustration of the light output profile of a pair of ideal LED element light-emitting regions (unmasked by any electrode structure) showing light emission intensity entering (50) and exiting (52) a lens having a predetermined MTF.

Turning now to FIG. 4, it illustrates the one-dimensional case of the light output profile of two ideal LED elements (unmasked by any electrode structure) showing light emission intensity before (50) it enters and after (52) it exits a lens having a predetermined MTF. The light output of the two idealized adjoining LED active regions is at full intensity, or "1.0", across each active region and at no intensity or "0" in the insulative regions or gaps between the active regions. Of course, in the typical LED element or region 18 shown in FIG. 1, a centrally disposed light blocking electrode 21 would attenuate light output in a central region to 0 if present, as shown in FIGS. 6A and 6B of the '684 patent, for example. Disregarding the electrodes for the moment, the idealized light output profile 50 shown in FIG. 4 is a square wave that repeats along the length of the LED array of successive active light-emitting regions 18. The idealized square wave light profile 50 also is not readily realizable with LED arrays due to light refraction and reflection at the edges of each light-emitting region 18 and due to spreading resistance effects that result in non-uniform current injection within each active region 18.

Using the above referenced typical MTF for a SELFOC SLA-12 lens, the post-lens light profile 52 (after passing through the lens) exhibits a sinusoidal waveshape with a peak centered at the centerline of the active light-emitting region and a trough at the centerline of the insulative gap between each active light-emitting region between adjacent LEDs. The blurring effect of the lens makes it incapable of focusing the squared light profile 50 with 100% accuracy for the reasons described in the above referenced article. The widths of the active regions and the gaps there between are also dictated by the DPI resolution desired; i.e., the number of LEDs per unit length. The blurring effect of the lens together with imperfection in the light output profile across the width of the active regions 18, particularly as DPI resolution is increased, causes the actual light output profile 52 after lensing to depart from the idealized profile 50 shown in FIG. 4.

Figure 5:
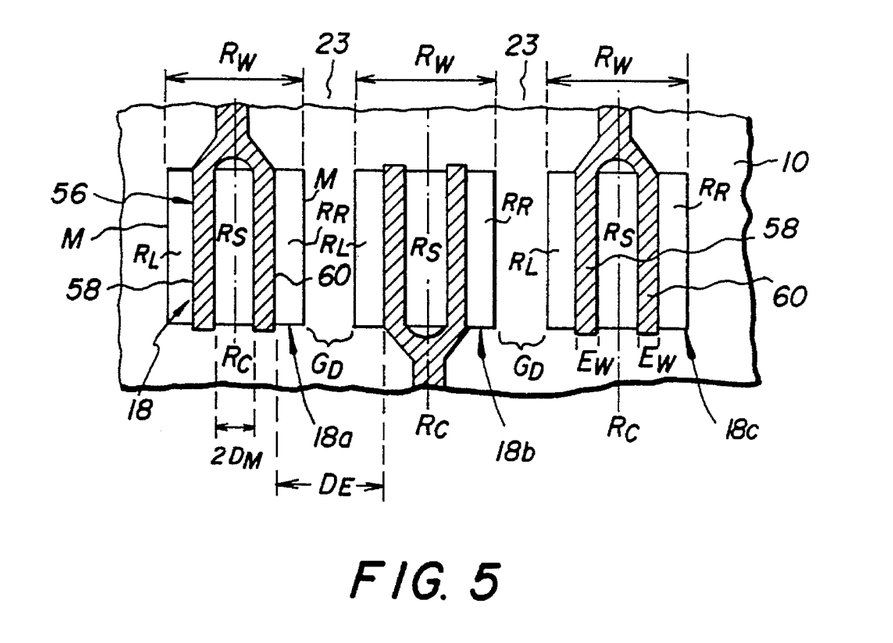
FIG. 5 is a schematic top view of a section of an LED array with three light-emitting regions each having a bifurcated electrode overlying the regions in accordance with one aspect of the invention.

FIG. 5 shows an optimized LED design taking the lens LSF into consideration for a 400 DPI LED array. The design utilizes a bifurcated electrode 56 constructed with two branch opaque electrodes 58 and 60 each of 6.5 µm ($E_w$) width deposited on a total light-emitting region 18 of width $R_W$ of 47.5 µm which is comprised of three separate light emitting sub-regions. The central light-emitting sub-region $R_S$, between the branch electrodes 58 and 60, is 13 µm wide. The left and right light-emitting sub-regions $R_L$ and $R_R$ are each 10.75 µm wide and are defined between an edge of an electrode and an edge M of a generally opaque mask. The branch electrodes 58 and 60 extend in parallel as finger-like traces with the active region centerline $R_C$ and transversely to the direction of the row of LEDs in the array. The gap distance $G_D$ of the gap space 23 between adjacent light-emitting, active regions 18a, 18b, 18c is 16 µm wide, so that the adjacent branch electrodes 58, 60 from each one to the next light emitting region 18 are spaced apart a distance, $D_E$, of 37.5 µm.

The location and spacing of the electrode pattern is selected in accordance with the invention so that the convolution of the LSF of the lens array with the light output profile of the LEDs is such that there obtains minimal impact; i.e. less fall off, in the interpixel or gap 23 area.

Figure 6:
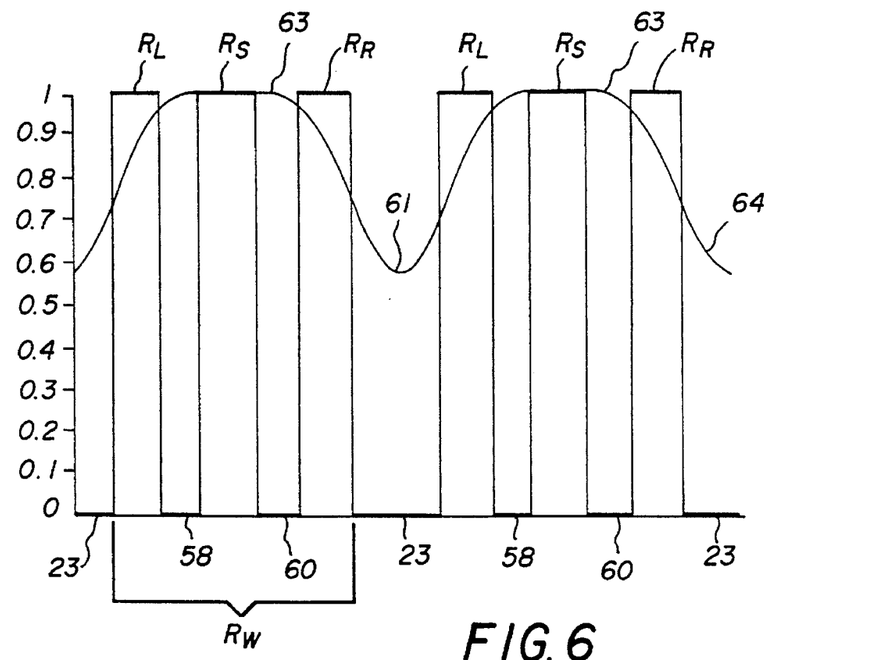
FIG. 6 is an illustration of the light output profile of a pair of LED regions of FIG. 5 showing light emission intensity entering and exiting a lens having a predetermined MTF.

FIG. 6 shows the effect of the size and placement of the electrodes 58,60 in relation to the lens LSF on the light pixels generated by the LED elements of FIG. 5 and as focused by the lens on the photosensitive medium. The gap 23 still causes the valley 61 in the sinusoidal light output profile 64, but the placement of the electrodes 58, 60 reduces falloff in this gap area 23.

Figure 13:
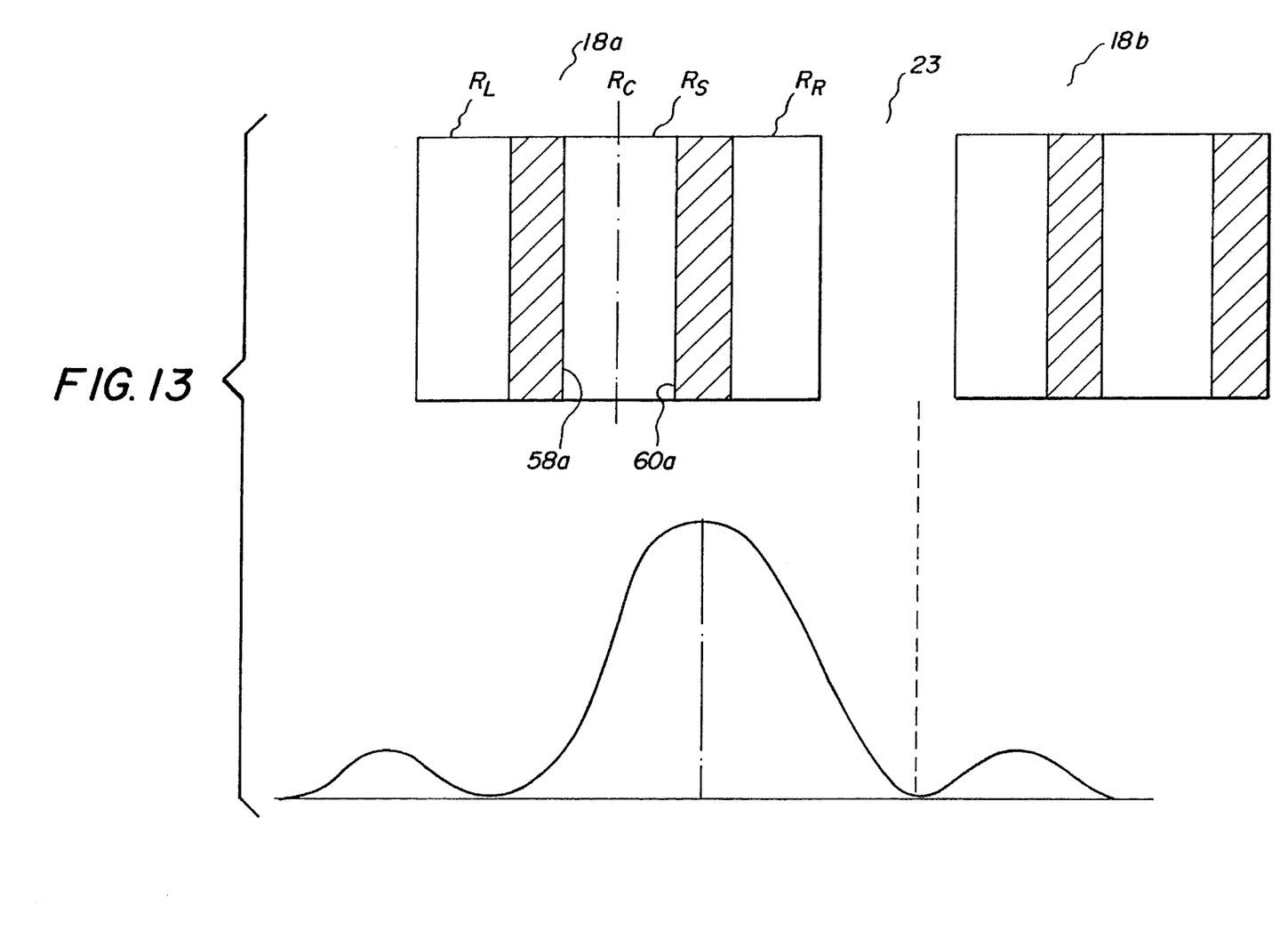
FIG. 13 illustrates a line spread function of a lens array aligned with a centerline of an electrode.

FIG. 13 is a schematic that illustrates the LSF of the lens being aligned with the centerline of electrode 60. As may be seen, a null or minimum (see arrow) of the LSF falls in the image plane at a location corresponding to a location within the gap 23 between LEDs. This indicates that this placement of the electrode 60 has a minimal affect on light contributions in the gap area 23, but hits a relatively greater affect in reducing the peak in the center; therefore, the overall light profile of the LED appears flatter. A similar showing can be made for the position of electrode 58.

Figure 8:
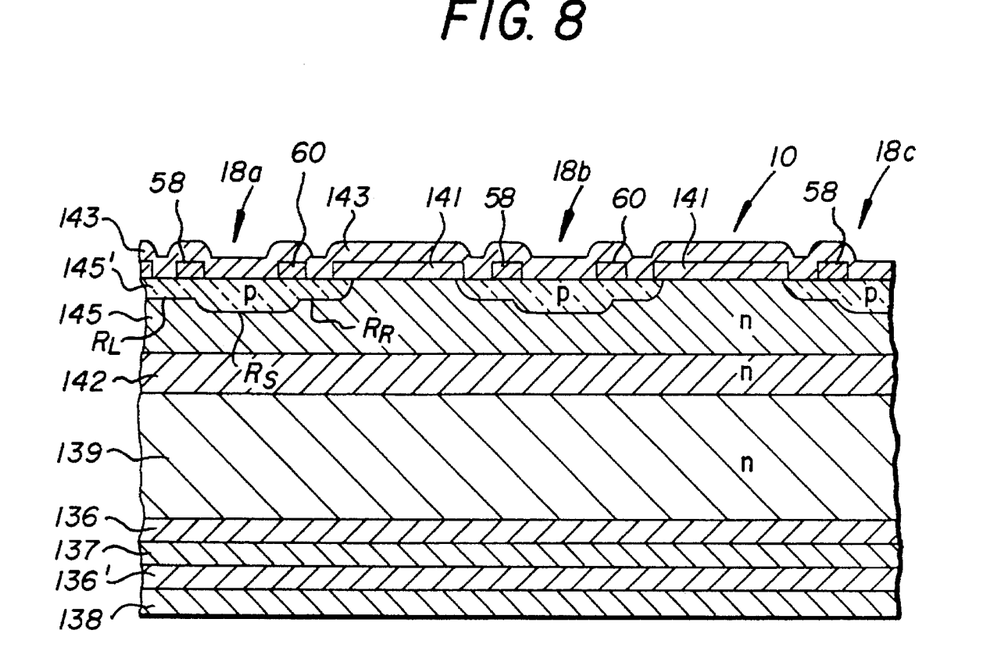
FIGS. 8 and 9 are illustrations of the variation in diffusion depth of the semiconductor light-emitting layer to vary the intensity of the emitted light in a sub-region falling between the bifurcated electrodes of the LED elements of FIG. 5 in accordance with other aspects of the invention.
Figure 9:
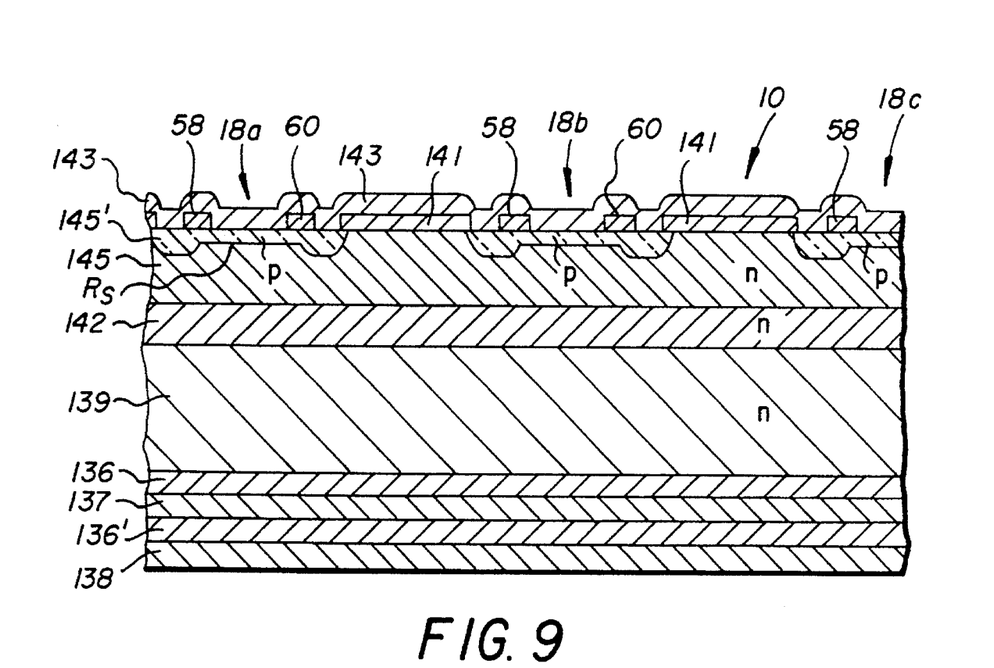
Figure 10:
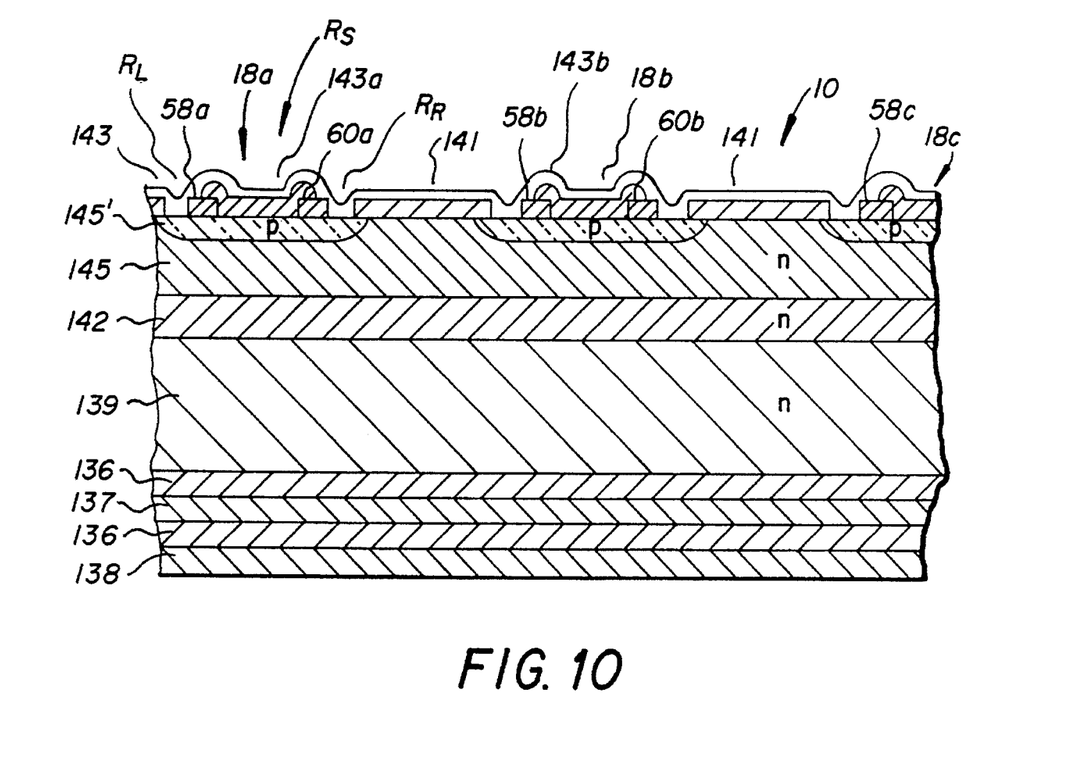
FIG. 10 is an illustration of the variation of the thickness of an anti-reflection coating layer overlying a semiconductor light-emitting layer to vary the intensity of the emitted light in a sub-region falling between the bifurcated electrodes of the LED elements of FIG. 5 in accordance with still another aspect of the invention.
Figure 11:
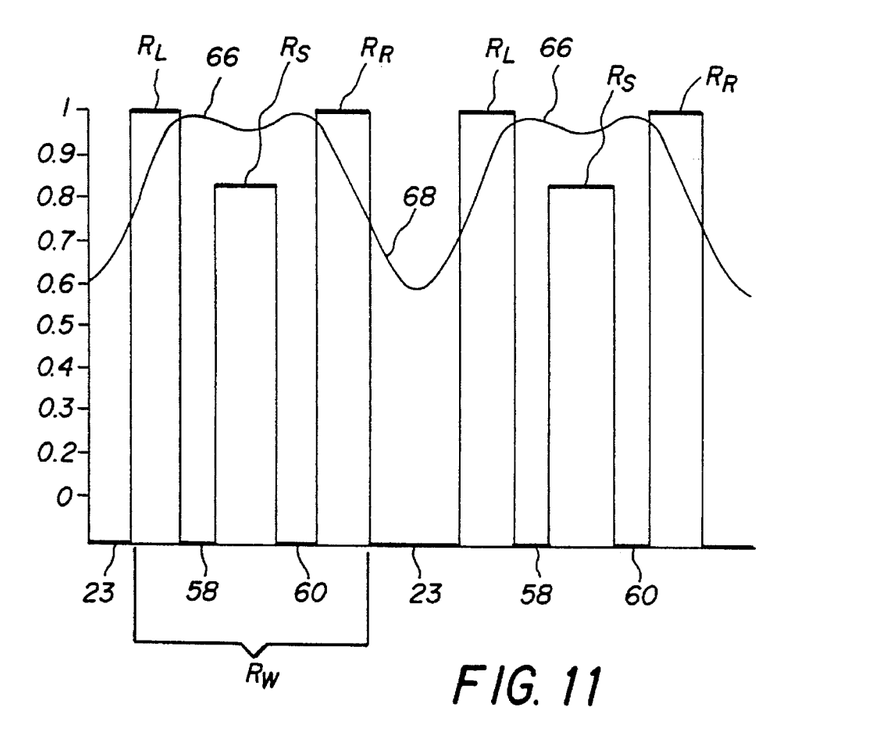
FIG. 11 is an illustration of the light output profile of a pair of LED regions of FIG. 5 showing light emission intensity entering and exiting a lens having a predetermined MTF modified in accordance with the approaches illustrated in FIGS. 8–10.

Steps may be taken in accordance with a further aspect of the invention to flatten the output light profile by decreasing light output intensity in sub-region $R_S$ in accordance with the techniques illustrated in FIGS. 8–10. The results are shown in the light output profile of FIG. 11 which yields a significant improvement. It may be seen that the peak 66 of the light profile 68 within the light emitting region is considerably flatter. Secondly, the amount of light falloff in the non-light emitting gaps 23 between adjoining LED active regions 18 is not greatly affected. The flattening of the peak 66 is the effect of a lessening in the light output in the sub-region $R_S$ which may be accomplished by further tailoring of the semiconductor fabrication techniques.

Figure 7:
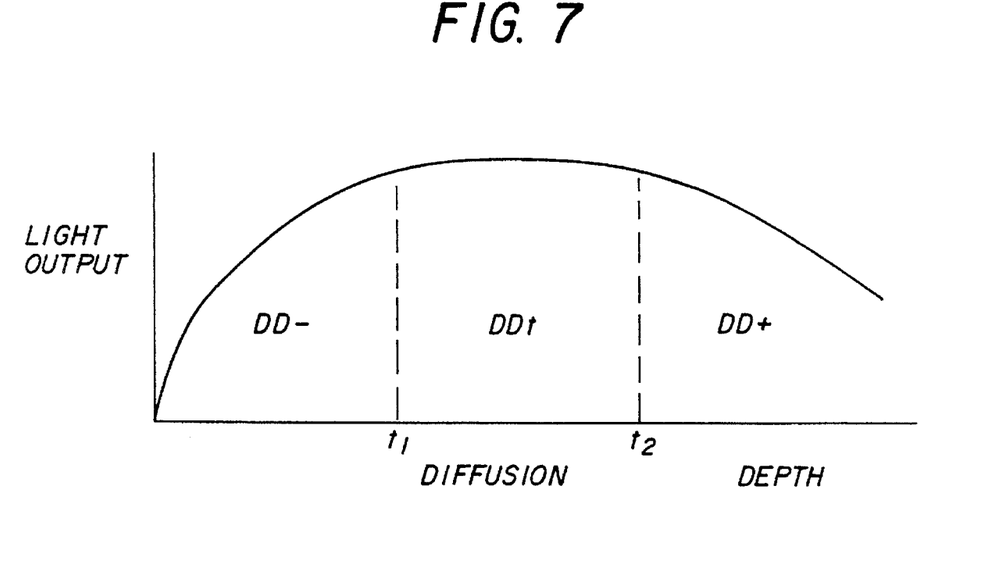
FIG. 7 is a graph illustrating the effect of active region thickness on light emission intensity.

Referring to FIG. 7, the relationship of light output intensity to diffusion depth is illustrated. As diffusion depth increases, light output from this light-generating layer increases until light absorption starts to occur due to the increasing layer thickness. Thus the thickness can be made either thinner or thicker on either side of the normal target thickness zone $t_1-t_2$ in order to decrease light output. FIG. 8 shows increased diffusion depth DD+ within the central sub-region $R_S$ of the light-emitting region 18 of each LED element 18a, 18b, 18c. FIG. 9 shows decreased diffusion depth DD− within the central sub-region $R_S$ of the light-emitting region 18. In both FIGS. 8 and 9 the two outer sub-regions $R_L$, $R_R$ of each LED element region 18a, 18b, 18c are at the target diffusion depth DDt.

The general processes for fabricating the LED elements and array are described in commonly assigned U.S. Pat. No. 4,644,342 to Abbas and U.S. Pat. No. 5,077,587 to Albergo et al, both incorporated by reference herein. The LEDs are formed on wafers that are then separated or diced into individual arrays. Referring again to FIGS. 8 and 9, they depict in cross-section the semiconductor and coating layers forming adjacent LED active light-emitting regions 18a, 18b, 18c in each case. These regions thus represent three LED elements. Layer 139 is a semiconductor crystal of n-type gallium arsenide of a thickness from about 250 µm to 400 µm. A layer 142 of n-type, graded-composition, gallium arsenide phosphide is grown epitaxially on the surface of the semiconductor crystal 139. The amount of phosphorus P in the layer 142 is gradually increased as it is grown such that its composition varies from GaAs at the beginning of growth to, for example, $GaAs_{0.7}P_{0.3}$ at the end of growth. Layer 142 is from about 15 µm to 30 µm thick. An n-type layer 145 of constant composition, say $GaAs_{0.7}P_{0.3}$ as a specific example but more generally $GaAs_{1-x}P_x$, is then grown on the graded composition layer 142 to a thickness of from about 15 µm to 30 µm. Those skilled in the art will realize that the graded composition layer 142 reduces the effect of the strain induced on the devices fabricated in the constant composition layer 145 due to the lattice mismatch between the GaAs layer 139 and the $GaAs_{1-x}P_x$ layer 145.

A layer 136 formed of evaporated nickel, a layer 137 formed of evaporated gold germanium, and another layer 136' formed of evaporated nickel are deposited successively on the bottom side of the gallium arsenide crystal 139. The metal layers 136 and 137 are then alloyed to the semiconductor 139 to improve the electrical contact. A layer 138 formed of evaporated gold or other metal or metal alloy is deposited on layer 136'. Layer 138 provides a common cathode for all the array LEDs and is electrically connected to ground. Layers 136, 136', 137 and 138, as will be appreciated by those skilled in the art, make good ohmic electrical ground contact to the n-type gallium arsenide crystal 139.

In the process of fabricating the active light-emitting regions 18a, 18b, 18c, a masking film 141 of silicon nitride is grown by plasma deposition on the layer 145. Windows are etched by a conventional photolithographic technique in the film 141. The silicon nitride film 141 serves as a mask for the diffusion of p-type impurities (for example, zinc) into layer 145. A film of zinc oxide is grown on the silicon nitride film 141, and on the epitaxial layer 145 within the windows in the silicon nitride film, by chemical vapor deposition from dimethyl zinc and oxygen. A film of silicon dioxide is then grown on both sides of the entire LED wafer, containing arrays 10, by chemical vapor deposition from silane and oxygen to protect the array from decomposition during the diffusion process. The wafer-containing arrays 10, is then placed in a furnace at an elevated temperature for a time interval sufficient for the zinc to diffuse into the n-type epitaxial layer 145 to a depth of about 2 µm, forming the p-type regions 18a, 18b, 18c each having a thickness denoted 145'. The zinc oxide film serves as a source of zinc; other methods can be used to diffuse zinc into layer 145, e.g. vapor-phase transport from a zinc arsenide source, zinc-doped spin-on emulsions, and ion implantation.

In FIGS. 8 and 9, the thickness 145' of the p-type light-emitting regions 18a, 18b, 18c are shown as varied so as to be thicker or thinner, respectively, in the sub-regions $R_S$ between each electrode pair 58, 60 to decrease light output in accordance with the curve of FIG. 7 as described above. The thicker or deeper diffusion in the depicted sub-regions $R_S$ or $R_R$ and $R_L$ may be accomplished by additional masking and diffusion steps of the type described above.

For example, the resulting thickness 145' depicted in FIG. 8 may be attained by initially depositing a silicon nitride mask extending over the sub-regions $R_R$ and $R_L$ as well as the space later occupied by the electrodes 58 and 60 so that windows only appear over the sub-regions $R_S$. The zinc oxide layer is then deposited over the windows and then the protective silicon dioxide layer is deposited over the wafer which contains arrays 10. The array is subjected to an elevated temperature and then each of the deposited layers is removed. Thereafter, the process is then repeated with expanded windows exposing the entire regions 18a, 18b, 18c as described in the preceding paragraph. This "double diffusion" process results in deeper diffusion in the central sub-regions $R_S$ in each case, thus, rendering this sub-region in the DD+ region of FIG. 7. Similarly, the double diffusion process may be employed to subject the side sub-regions $R_R$ and $R_L$ to double masking, zinc oxide exposure and silicon dioxide deposition, baking and removal resulting in the increased thickness 145' of the diffusion depth depicted in FIG. 9 of the sub-regions $R_R$ and $R_L$ and thereby rendering them in the DD+ region of FIG. 7.

Alternatively, a single silicon nitride masking layer 141 having the pattern as shown in FIGS. 8 and 9 may be employed, but the zinc oxide layer may be selectively deposited as a patterned diffusion source only over the central or side sub-regions $R_S$ or $R_R$ and $R_L$, respectively, in the initial deposition, baking and removal steps. In the subsequent deposition step, the zinc oxide layer may be deposited over the exposed regions and the silicon nitride protective film, covered with the silicon dioxide layer and baked as described above, resulting in the thicknesses 145' depicted in FIGS. 8 and 9.

Following any of the above described double diffusion methods, the silicon dioxide and the zinc oxide films are removed from the surface of the doped $GaAs_{1-x}P_x$ surface layer. The metal anode electrodes 58, 60 for contacting the p-type regions of the light-emitting diodes are formed from evaporated aluminum using standard photolithographic and metal liftoff techniques at the appropriate distance from the centerline of the regions 18a, 18b, 18c. The electrodes 58, 60 are alloyed to layer 145 to improve electrical contact and mechanical adhesion. Electrodes 58 and 60 are deposited along with the other trace conductors so that each respective electrode pair is connected together and to a conductor 21 alloyed to the silicon nitride layer 141 and extending to a bonding pad on the array 10 in the manner shown in FIGS. 1 and 5. Finally, the anti-reflection film 143 of silicon nitride is then deposited over the electrodes 58, 60, the silicon nitride masking layer 141, and onto the doped epitaxial layer 145 to an appropriate thickness to form an anti-reflection coating. The thickness of the anti-reflection film is typically chosen to avoid light loss through internal reflection as explained in commonly assigned U.S. Pat. No. 5,077,587 to Albergo et al.

With reference to FIG. 10, a second approach to decreasing light output in the central sub-region $R_S$ which may be used alternatively or to supplement the effect achieved above is to select the thickness of the anti-reflection coating (ARC) of $Si_3N_4$ over the central sub-region so that this thickness of anti-reflection coating causes a decrease in the light output level from the central sub-region. As explained in the above referenced '587 patent, light emission is disclosed in that patent to be enhanced by selecting a total anti-reflection coating (ARC) and masking layer thickness that minimizes reflectance, particularly where the masking layer window edge overlaps the active light-emitting region. In the '587 patent, advantage is taken of the cyclic nature of the reflectivity vs. thickness of silicon nitride films in order to arrive at varying film thicknesses that provide the same degree of reflectance to enhance light output; i.e. the thickness of the ARC may be said to provide a generally tuned condition for light output.

Conversely, in accordance with this aspect of the present invention, a thickness of an anti-reflection layer that increases internal reflectance may be selected in order to decrease light output intensity in the selected sub-region; i.e. the thicknesses of the ARC provides a generally detuned condition for light output. The thickness of the anti-reflection coating in the central sub-regions $R_S$ thus may be either thicker or thinner than one of the periodically repeating thicknesses of minimal reflectance shown in FIG. 6 of the '587 patent and employed over the side sub-regions $R_R$ and $R_L$.

FIG. 10 illustrates the results of this second approach of modifying the thickness of the anti-reflection coating 143, in the central sub-regions $R_S$ of each of the LEDs or light-emitting regions 18a and 18b. The illustrated thickness variation may be accomplished in the final stages of fabrication by any of the methods described above by simply adding a photoresist masking step following the deposition of a minimally reflective silicon nitride (SiN) protective film, then removing the SiN film except in the central sub-region $R_S$, and repeating the deposition of a further thickness 143a of the silicon nitride protective film over the entire light-emitting sub-regions of each of the light-emitting regions 18a, 18b so that the resulting total SiN thickness in the sub-region $R_S$ has relatively high internal reflection and tends to depress the intensity of the emitted light from the sub-region $R_S$ whereas the thickness of the SiN film over the sub-region $R_L$ and $R_R$ are optimized for minimal reflectance and maximal light emission.

Alternatively, one may simply add a photoresist masking step following the deposition of a minimally reflective SiN protective film, then remove the SiN film from the central subregions $R_S$ but not the lateral subregions $R_L$, $R_R$ and repeat the deposition of a further thickness of the SiN protective film over the entire light-emitting sub-regions of each of the light-emitting regions 18a, 18b so that again the resulting ARC thickness over the central sub-region $R_S$ is provided with a detuned condition for light output and thus a depressed light output is provided therefrom whereas the light outputs from the lateral subregions $R_L$, $R_R$ are affected by minimal reflectance and thus are maximal.

As a further alternative for obtaining a generally detuned condition with regard to light emission from the central region, Rs, combinations of alternating anti-reflection coatings (SiN) and reflection coatings (Si) may be used to depress light emissions.

The design processes of the present invention can be applied to LED design at all resolutions and for lens types other than the SELFOC SLA-12 lens described above.

In accordance with the invention, an LED array of LED elements is fabricated so that the peaks and valleys of the light profile of the LED array of spaced apart, discrete LED elements are flattened at the image plane. The fabrication involves employing the LSF of the lens used with the LED array to focus its light on a photosensitive medium to determine the allowable size and positioning of light blocking electrodes overlying adjacent LED regions, such that the blurring effect of the lens will fill in the valleys in the light profile and provide a desired light profile influenced by the positions of the opaque electrodes. The electrodes then function not only as a means for current injection into the LED, but also to modulate light intensity across the width of the region to aid in properly shaping the LED light output profile to best fit the lens characteristics. In lieu of having the electrodes serve this dual function, the invention also contemplates a construction wherein transparent electrodes are placed over the entire area of each LED but opaque finger-like traces that do not function as electrodes are provided at the locations defined for electrodes in the above embodiments.

The LSF of the lens may also be used to define areas in which to adjust the light-emitting layer or anti-reflection coating thicknesses in directions extending across the LED regions to accentuate or attenuate light output intensity. Preferably, diffusion of specific sub-regions to different depths within each light-emitting region of an LED element, or the adjustment of anti-reflective coating thicknesses over specific sub-regions of each LED element, are employed. In this regard, the change in diffusion depth of an LED will correspond to locations for positioning the centers of the opaque electrodes using an analysis similar to that shown in FIG. 13 and this is applicable even if no opaque electrodes overly the LED. Similarly, where no opaque electrodes overly the LEDs the locations of the sub-regions of different total thickness of ARC are also such that preferably a detuned condition for light emission exists in a sub-region equivalent to the sub-region $R_S$. This results in providing a decreased output of light from the central region which region's size as determined using the LSF of the lens array has minimal affect upon the light profile in valleys between imaged pixels and thereby provides for a more flattened imaged light profile.

Figure 14:
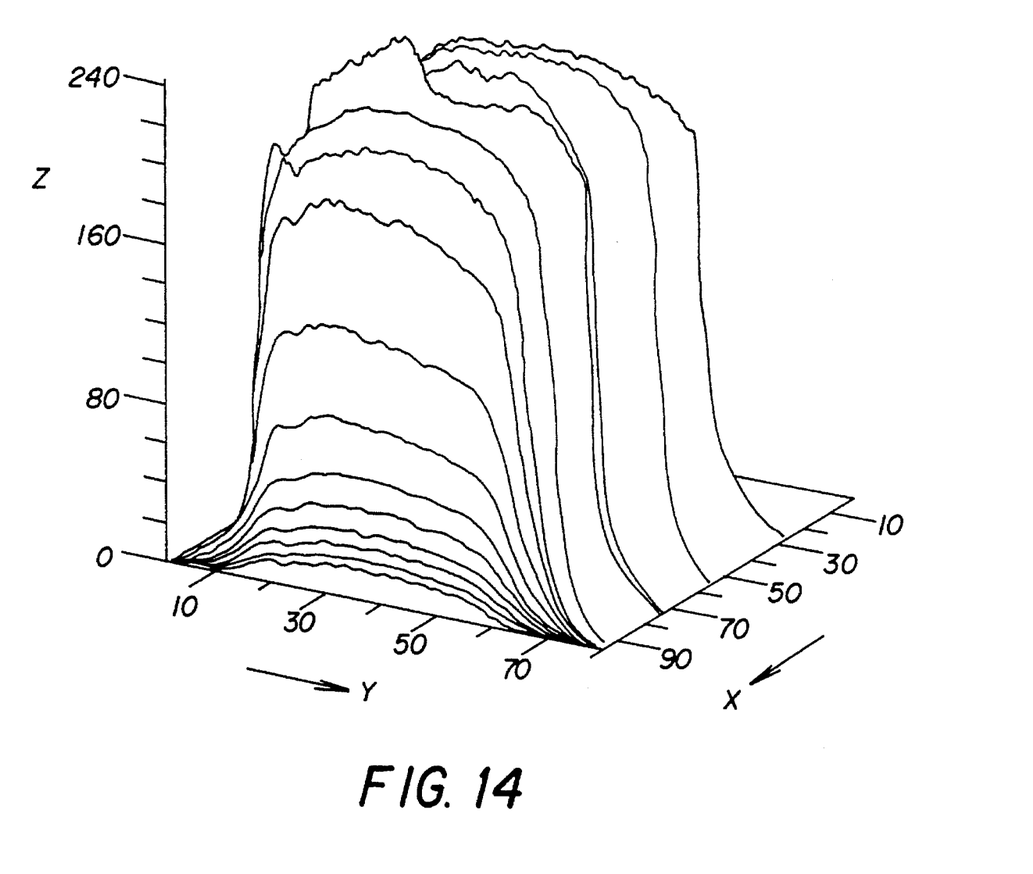
FIG. 14 illustrates a light output profile of an alternative embodiment of an LED that is made in accordance with the invention.

An example of tailoring of an LED light output profile is shown in FIG. 14 wherein when the "Y" dimension is also considered. It can be seen that in addition to opaque electrodes providing breaks in light output when the profile is viewed along the y axis, a saddle-like reduction is also visible in the central region due to either adjustment of diffusion depth in a corresponding LED diffusion layer area or by adjustment of anti-reflection coating thickness in accordance with the teachings above in an appropriate central area of the LED.

The tailoring of the dimensions of the active light-emitting regions and the bifurcated electrodes to the lens LSF characteristics results in less light intensity droop or fall off in the non-emitting areas between adjacent light-emitting regions or "pixels" after lensing. As this has advantages for LED arrays that do not employ opaque electrodes or finger-like traces which cover a portion of the light-emitting area, the invention also contemplates LED arrays similar to those shown in FIGS. 8–10 but which do not have such opaque electrodes or opaque traces. This yields three important advantages. First, the light-emitting region imaged on the photosensitive medium is closer to the ideal pixel width of 63.5 μm, resulting in better image quality. Secondly, the light-emitting region when imaged on the photosensitive medium has a more uniform light profile throughout the ideal pixel width, also improving image quality. Thirdly, when the pixel light profile is properly engineered, the width of the LED emitting area can be less while achieving the same or better light profile at the photosensitive medium. This eases the stringent butting gap tolerances of trimming the adjacent ends of end to end assembled arrays next to the end most active LED area to match the gap between adjacent light-emitting regions in the arrays.

Although the invention has been described with reference to LEDs, light-emitting elements other than LEDs may be used and obtain the benefits of the teachings herein and the term "light" implies electromagnetic radiation having frequency(ies) that may be within the visible range or outside thereof. In addition, shapes other than rectangular for the light-emitting elements may be provided as is known in the art.

While the invention has been described with particular reference to preferred embodiments thereof, it will be understood that variations and modifications can be effected within the spirit and scope of the invention.

Parts List for FIGS. 1–12 optical print head LED array 10
driver ICs 12 and 14
printed circuit board 16
LED element active region 18
adjacent light emitting, active regions 18a, 18b, 18c
array spacing 19
LED element pads 20
surface metal trace conductors 21
electrode 21'
driver IC bonding pads 22 and 24
gap 23
pad arrays 26 and 28
wires 30
gaps 32 and 34
LED array gaps 38
idealized light output profile 50
post-lens light profile 52
electrode 56
two branch electrodes 58 and 60
valley 61
peak 63
sinusoidal light output profile 64
edge of generally opaque mask M
total light emitting region 18 width $R_W$
central light emitting sub-region $R_S$
left and right light emitting sub-regions $R_L$ and $R_R$
active region centerline $R_C$
gap distance $G_D$
semiconductor crystal n-type gallium arsenide layer 139
evaporated nickel layers 136 and 136'
evaporated gold germanium layer 137
evaporated gold layer 138
gallium arsenide crystal 139
evaporated silicon nitride masking layer 141
n-type, graded-composition, gallium arsenide phosphide layer 142
anti-reflection silicon nitride layer 143
n-type layer 145 of constant composition $GaAs_{0.7}P_{0.3}$
thickness denoted 145'
LED array 200
SELFOC lens array 205
fibers of lens array 210
recording member 220

What is claimed is:

1. An apparatus, comprising:
   a lens array;
   a plurality of spaced light-emitting elements arranged in a row and provided at least approximately in an object plane of the lens array, each light-emitting element including a center light-emitting portion and side light-emitting portions, said portions being arranged in the direction of said row;

an anti-reflection coating arranged over each of said portions and wherein the thickness of the coating over the center portion is different than those over the edge portions so as to reduce emissions from said center portion and thereby flatten the light emission profile of each light-emitting element after lensing by said lens array.

2. The apparatus of claim 1 and wherein said center and side light-emitting portions are separated by opaque traces.

3. An apparatus comprising a combination of a lens array and an array of a plurality of discrete light-emitting elements, the light-emitting elements of the array including a respective plurality of light-emitting regions formed side-by-side in a semiconductor substrate, each region forming a light-emitting element having a centerline and a predetermined width defined by two mask edges that are generally parallel to and respectively to the left and right of the element centerline and each region separated from an adjacent region by a gap distance;

a pair of opaque finger-like traces overlying each region, each trace having a centerline extending in parallel with the element centerline and spaced to the left and right, respectively, on either side of the element centerline to separate each light-emitting region into three light-emitting sub-regions, a central sub-region and two lateral sub-regions one to the left and one to the right of the central sub-region, the centerline of the trace to the left of the element centerline being spaced substantially closer to the element centerline than to the respective left mask edge and the centerline of the trace to the right of the element centerline being spaced substantially closer to the element centerline than to the respective right mask edge; and said lens array being located at a distance spaced from said elements so that the elements are positioned at least approximately in an object plane of said lens array, said lens array having a line spread function (LSF) performance characteristic and said centerline of each trace being located such that the LSF of the lens array when convoluted with the light output profile of one of the elements taken at each centerline of the traces of said one of said elements forms at a corresponding image plane of the lens array a respective local minimum at a location corresponding to a gap between said one element and a respective adjacent element adjacent said one element, said respective adjacent element being the closest adjacent element to a respective one of said traces.

4. The apparatus of claim 3 wherein the traces are electrodes that are electrically connected together and are further electrically connected with a current driver IC.

5. The apparatus of claim 3 and including means for attenuating the intensity of light emitted in the central sub-region to diminish light output profile peaking by the lens.

6. The apparatus of claim 5 and wherein the attenuating means includes a dopant-diffused layer in the central sub-region having a thickness that is different than dopant-diffused layers located respectively in the lateral sub-regions.

7. The apparatus of claim 5 and wherein the attenuating means includes providing a detuned thickness of an anti-reflection layer overlying the central sub-region that differs from an optimum thickness of an anti-reflection coating overlying each of the lateral sub-regions on respective opposite sides from said central sub-region.

* * * * *